(12) United States Patent
Asaoka et al.

(10) Patent No.: US 11,309,509 B2
(45) Date of Patent: Apr. 19, 2022

(54) DISPLAY DEVICE AND MANUFACTURING METHOD FOR SAME

(71) Applicant: SHARP KABUSHIKI KAISHA, Sakai (JP)

(72) Inventors: Yasushi Asaoka, Sakai (JP); Shigeru Aomori, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 69 days.

(21) Appl. No.: 16/981,480

(22) PCT Filed: Mar. 22, 2018

(86) PCT No.: PCT/JP2018/011426
§ 371 (c)(1),
(2) Date: Sep. 16, 2020

(87) PCT Pub. No.: WO2019/180881
PCT Pub. Date: Sep. 26, 2019

(65) Prior Publication Data
US 2021/0036253 A1 Feb. 4, 2021

(51) Int. Cl.
*H01L 51/50* (2006.01)
*H01L 51/00* (2006.01)

(52) U.S. Cl.
CPC ........ *H01L 51/502* (2013.01); *H01L 51/0005* (2013.01)

(58) Field of Classification Search
CPC .................. H01L 51/502; H01L 51/0005
See application file for complete search history.

(56) References Cited

FOREIGN PATENT DOCUMENTS

JP 2010-009995 A 1/2010

*Primary Examiner* — Anthony Ho
(74) *Attorney, Agent, or Firm* — ScienBiziP, P.C.

(57) ABSTRACT

A display device is provided with a light-emitting element layer including an anode electrode, a cathode electrode, and a quantum dot light-emitting layer sandwiched between the anode electrode and the cathode electrode, wherein the quantum dot light-emitting layer includes at least quantum dots and nanofibers. A method for manufacturing a display device includes forming a quantum dot light-emitting layer by applying a colloidal solution including at least quantum dots and nanofibers by ink-jet.

10 Claims, 5 Drawing Sheets

DISPLAY DEVICE AND MANUFACTURING METHOD FOR SAME

TECHNICAL FIELD

The disclosure relates to a display device and a method for manufacturing the same.

BACKGROUND ART

PTL 1 discloses an ejection liquid including quantum dots, which are tiny particles, and a dispersion medium in which the quantum dots are dispersed, an ejection liquid set, a thin film pattern forming method, a thin film, a light-emitting element, an image display device, and an electronic device.

CITATION LIST

Patent Literature

PTL 1: JP 2010-9995 A

SUMMARY

Technical Problem

In general, because the properties of the quantum dots (QD) vary depending on the ligand, a ligand suitable for a quantum dot light emitting diode (QLED) is selected. The solvent (dispersion medium) is also limited by the ligand. In addition, the viscosity of the colloidal solution containing the quantum dots and the solvent that can be applied (ejected) by ink-jet is also limited. Furthermore, when the colloidal solution is applied by ink-jet, there is a problem in that drying unevenness (so-called coffee ring) occurs in the droplets after application.

Solution to Problem

A display device according to an aspect of the disclosure includes:
a light-emitting element including
an anode electrode,
a cathode electrode, and
a quantum dot light-emitting layer sandwiched between the anode electrode and the cathode electrode,
wherein the quantum dot light-emitting layer includes at least quantum dots and nanofibers.

A method for manufacturing a display device according to another aspect of the disclosure includes forming a quantum dot light-emitting layer by applying a colloidal solution including at least quantum dots and nanofibers by ink-jet.

Advantageous Effects of Disclosure

According to an aspect of the disclosure, a display device in which a uniform quantum dot light-emitting layer is formed without unevenness in thickness and no cracking can be provided.

According to an aspect of the disclosure, it is possible to provide a method for manufacturing a display device that can apply (eject) a colloidal solution by ink-jet, regardless of the viscosity of the solvent, and drying unevenness (so-called coffee ring) does not occur in the droplets after application.

BRIEF DESCRIPTION OF DRAWINGS

FIG. 5(a) is a plan view illustrating an example of the configuration of a layer of a light-emitting element layer. FIG. 5(b) is a plan view illustrating an example of light-emitting element layers formed in island shapes. FIG. 5(c) is a plan view illustrating an example of light-emitting element layers formed in strip shapes.

DESCRIPTION OF EMBODIMENTS

Hereinafter, "the same layer" means that the layer is formed in the same process (film formation process) as the layer to compare, "a lower layer" means that the layer is formed in an earlier process than the process in which the layer to compare is formed, and "an upper layer" means that the layer is formed in a later process than the process in which the layer to compare is formed.

Figure 1:
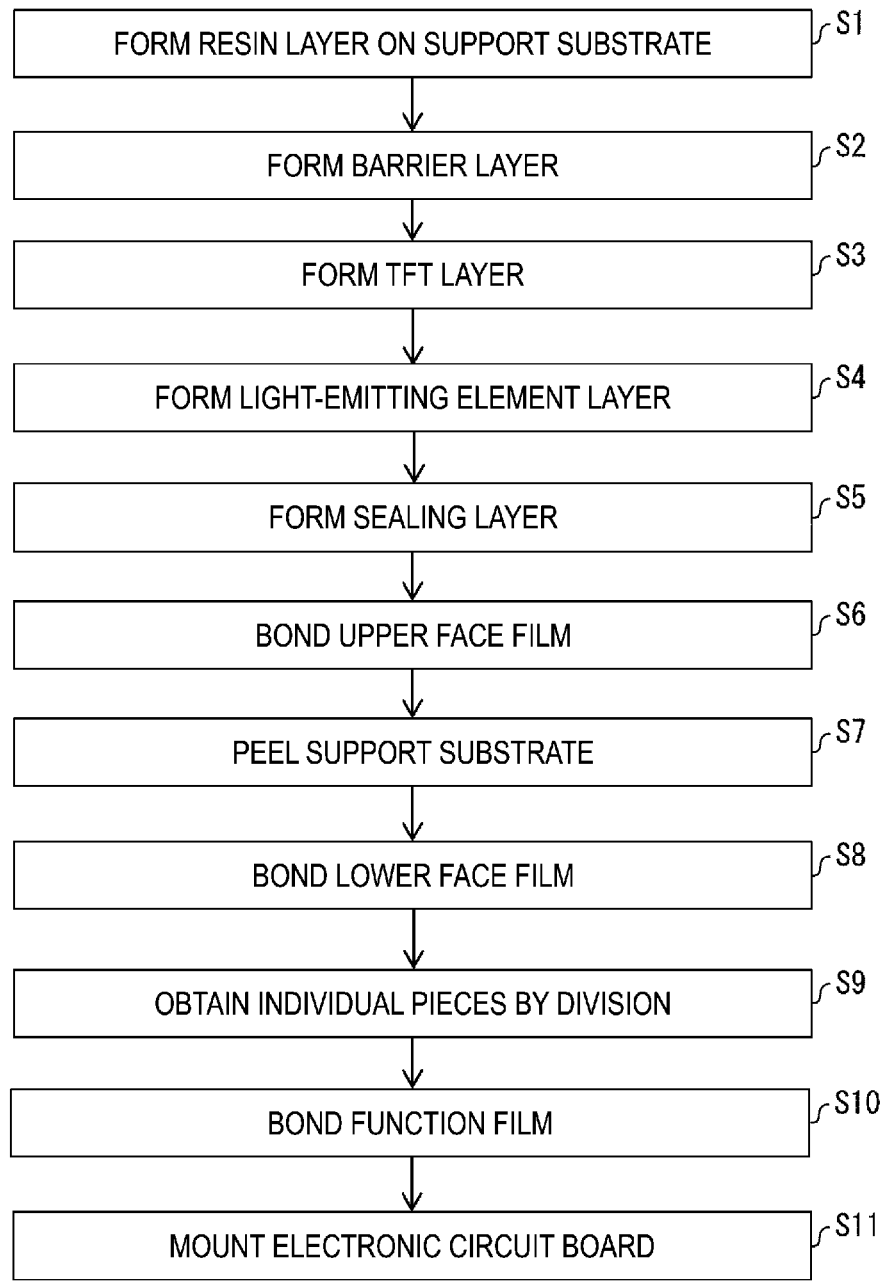
FIG. 1 is a flowchart illustrating an example of a method for manufacturing a display device.
Figure 2:
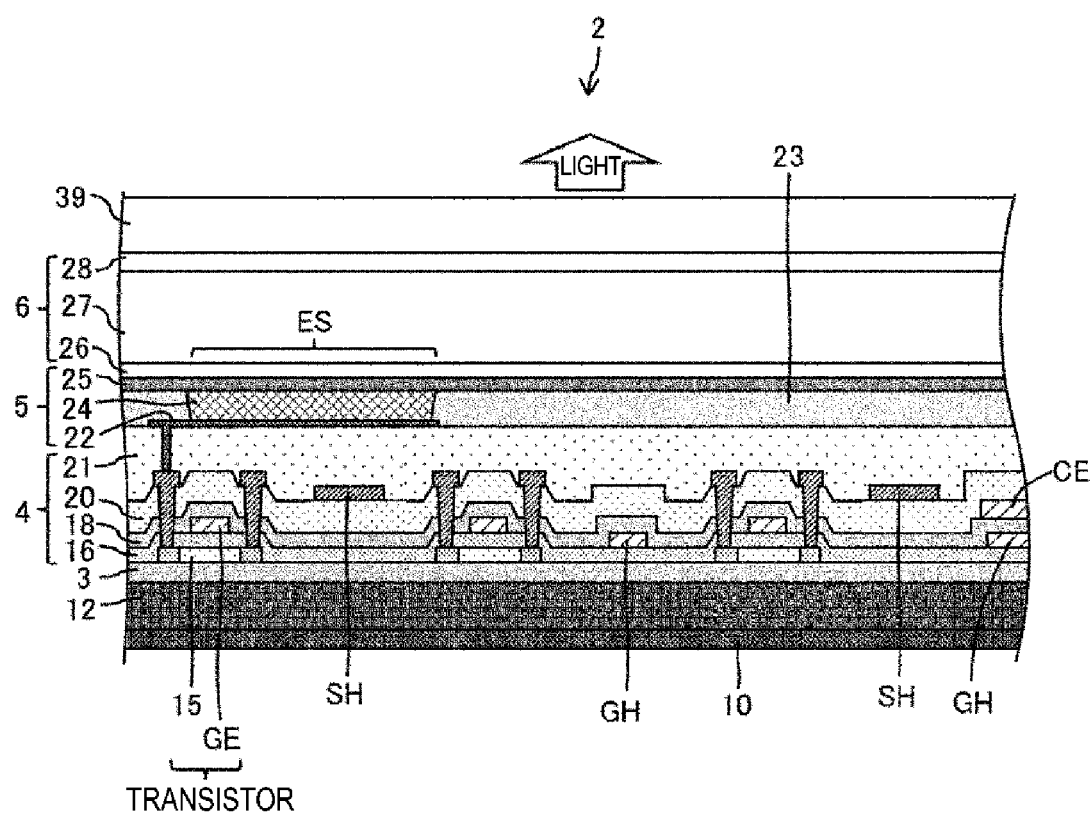
FIG. 2 is a cross-sectional view illustrating an example of the configuration of a display region of a display device.

FIG. 1 is a flowchart illustrating an example of a method for manufacturing display device. FIG. 2 is a cross-sectional view illustrating an example of the configuration of a display region of a display device.

As illustrated in FIG. 1 and FIG. 2, in a case where a flexible display device 2 is manufactured, first, a resin layer 12 is formed on a transparent support substrate (a mother glass, for example) (step S1). Next, a barrier layer 3 is formed on the resin layer 12 (step S2). Thereafter, a TFT layer 4 is formed on the barrier layer 3 (step S3), a top-emitting light-emitting element layer 5 is formed on the TFT layer 4 (step S4), a sealing layer 6 is formed on the light-emitting element layer 5 (step S5), and an upper face film is bonded to the sealing layer 6 (step S6).

Next, the support substrate is peeled from the resin layer 12 via laser light irradiation or the like (step S7). Thereafter, a lower face film 10 is bonded to the lower face (the face opposite the face where the barrier layer 3 is formed) of the resin layer 12 (step S8). Then, a layered body including the lower face film 10, the resin layer 12, the barrier layer 3, the TFT layer 4, the light-emitting element layer 5, and the sealing layer 6 is divided and a plurality of individual pieces are obtained (step S9). Next, a function film 39 is bonded on the sealing layer 6 of the obtained individual pieces (step S10). Subsequently, an electronic circuit board (for example, an IC chip or FPC) is mounted to a portion (terminal portion) located outward (a non-display region, frame) from the display region where a plurality of subpixels are formed (step S11). Note that steps S1 to S11 are executed by a display device manufacturing apparatus (that includes a film formation apparatus for executing the processes of steps S1 to S5).

Examples of the material of the resin layer 12 include a polyimide and the like. In addition, the resin layer 12 can be replaced by a bilayer resin film (for example, a polyimide film) or an inorganic insulating film sandwiched between these resin films.

The barrier layer 3 is a layer that inhibits foreign matters such as water and oxygen from entering the TFT layer 4 and the light-emitting element layer 5, and the barrier layer 3 can be constituted by a silicon oxide film, a silicon nitride film, or a silicon oxynitride film, or by a layered film of these, formed by chemical vapor deposition (CVD).

The TFT layer 4 includes a semiconductor film 15, an inorganic insulating film 16 (gate insulating film) in an upper layer overlying the semiconductor film 15, a gate electrode GE and a gate wiring line GH in an upper layer overlying the inorganic insulating film 16, an inorganic insulating film 18 in an upper layer overlying the gate electrode GE and the gate wiring line GH, a capacitance electrode CE in an upper layer overlying the inorganic insulating film 18, an inorganic insulating film 20 in an upper layer overlying the capacitance electrode CE, a source wiring line SH in an upper layer overlying the inorganic insulating film 20, and a flattening film 21 (interlayer insulating film) in an upper layer overlying the source wiring line SH.

The semiconductor film 15 is formed of tow-temperature polysilicon (LTPS) or an oxide semiconductor (for example, a In—Ga—Zn—O based semiconductor), for example. Also, a transistor (TFT) is formed to include the semiconductor film 15 and the gate electrode GE. The transistor is illustrated as a top gate structure in FIG. 2; however, the transistor may have a bottom gate structure.

The gate electrode GE, the gate wiring line GH, the capacitance electrode CE, and the source wiring line SH are each composed of a single layer film or a layered film of a metal, for example. The metal includes at least one of aluminum, tungsten, molybdenum, tantalum, chromium, titanium, and copper, for example. The TFT layer 4 in FIG. 2 includes a single semiconductor layer and a three metal layers.

Each of the inorganic insulating films 16, 18, and 20 can be formed of, for example, a silicon oxide (SiOx) film or a silicon nitride (SiNx) film, or a layered film of these, formed using CVD. The flattening film 21 can be formed of, for example, a coatable organic material such as polyimide or acrylic resin.

The light-emitting element layer (light-emitting element) 5 includes an anode (anode electrode) 22 as an upper layer of the flattening film 21, an anode cover film 23 with insulating properties configured to cover an edge of the anode 22, an organic electroluminescence (EL) layer 24 as an upper layer of the anode cover film 23, and a cathode (cathode electrode) 25 as an upper layer of the EL layer 24. The anode cover film 23 is formed by applying an organic material such as a polyimide or an acrylic resin and then by patterning the photosensitive organic material by photolithography, for example.

For each subpixel, as the light-emitting element ES including the island-shaped anode 22, the EL layer 24, and the cathode 25, the quantum dot light emitting diode (QLED) is formed in the light-emitting element layer 5, and a subpixel circuit for controlling the light-emitting element ES is formed in the TFT layer 4.

The EL layer 24 has a multilayer structure including, for example, in order from the lower layer side (the TFT layer 4 side), a hole injection layer, a hole transport layer, a light-emitting layer (quantum dot light-emitting layer), a charge transport layer, and a charge injection layer. The light-emitting layer is formed in an island shape or a strip shape (see FIG. 5) so as to cover the opening of the anode cover film 23 (for each subpixel) by spray application or ink-jet method through an opening mask. Other layers are formed in an island shape, a strip shape, or a solid-like shape (common layer). The EL layer 24 may also have a configuration in which one or more layers, from among the hole injection layer, the hole transport layer, the charge transport layer, and the charge injection layer, are not formed.

The charge injection layer and the charge transport layer function to efficiently inject and transport charge received from the cathode into the light-emitting layer. Examples of the material of the charge transport layer include $TiO_2$, AlZnO, or ZnO, Mg, and Li doped ZnO inorganic nanoparticles, C60, tris(8-hydroxyquinoline) aluminum (Alq3), and the like.

The hole injection layer and the hole transport layer function to efficiently inject and transport holes received from the anode into the light-emitting layer. Examples of the material of the hole transport layer include polythiophene-based conductive polymers (PEDOT: PSS), 4,4'-bis[N-(1-naphthyl)-N-phenyl-amino]biphenyl) (α-NPD), 4,4'-bis (9H-carbazol-9-yl)biphenyl (CBP), Dipyrazino[2,3-f:2',3'-h]quinoxaline-2,3,6,7,10,11-hexacarbonitrile (HAT-CN), N,N'-bis-(3-methylphenyl)-N,N'-bis-(phenyl)-benzidine (TPD), or $MoO_3$, NiO, $V_2O_3$, $WO_3$, CuSCN, and the like.

Figure 5:
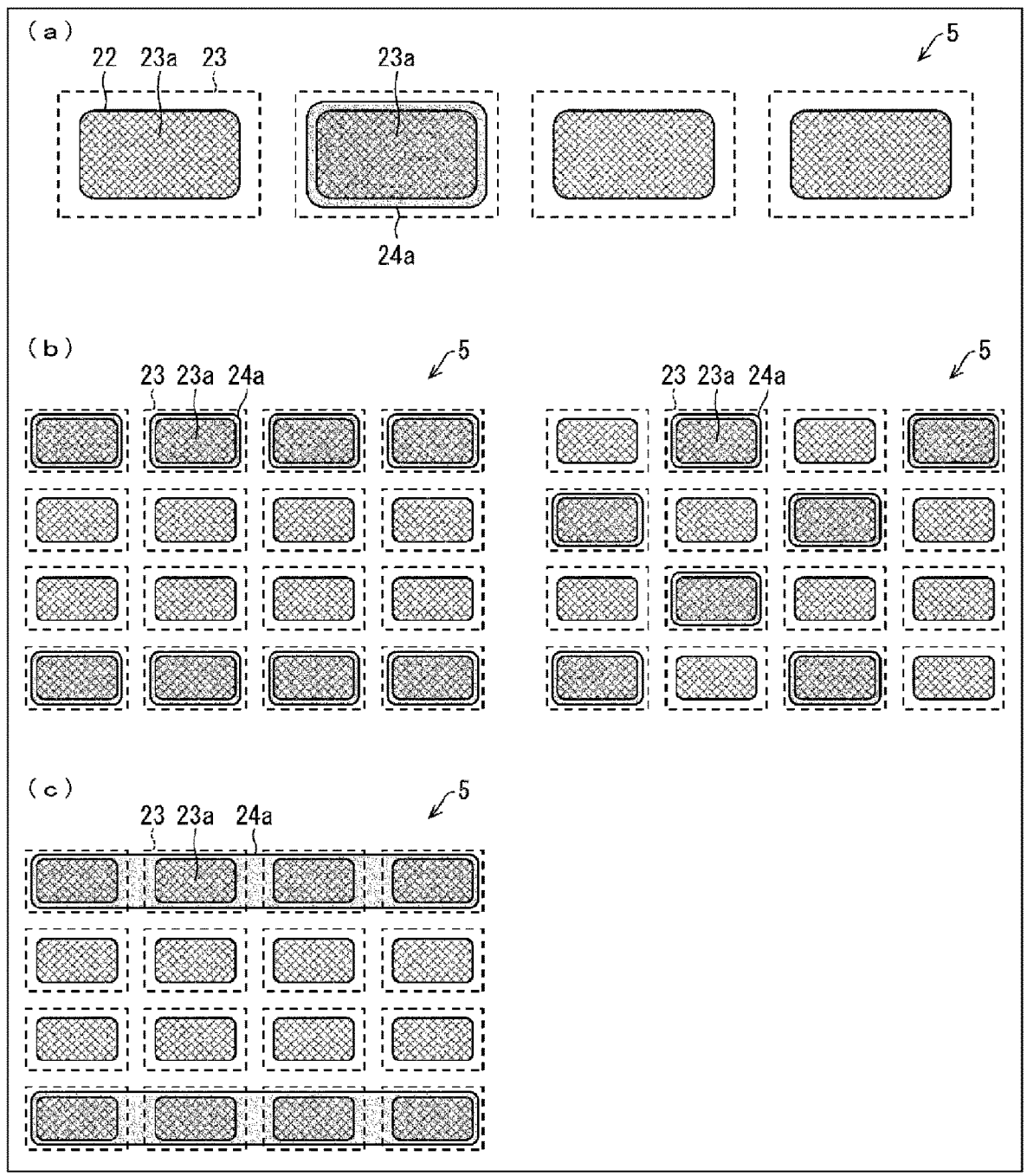
FIG. 5 is a plan view illustrating an example of a formed state of a light-emitting element layer.

FIG. 5 is a plan view illustrating an example of a formed state of the light-emitting element layer. FIG. 5(a) is a plan view illustrating an example of the configuration of a layer of the light-emitting element layer. FIG. 5(b) is a plan view illustrating an example of light-emitting element layers formed in island shapes. FIG. 5(c) is a plan view illustrating an example of light-emitting element layers formed in strip shapes. As illustrated in (a) of FIG. 5, the light-emitting element layer 5 includes, for example, the anode cover film 23 covering the edge of the anode 22 and a light-emitting layer 24a covering an opening 23a of the anode cover film 23. For example, in a case in which the light-emitting element layer 5 is formed in island shapes, a pattern (two types are illustrated) such as that illustrated in (b) of FIG. 5 is formed, and in a case in which the light-emitting element layer 5 is formed in strip shapes, a pattern such as that illustrated in (c) of FIG. 5 is formed. In other words, the light-emitting layer 24a, for example, is formed in island shapes as illustrated in (b) of FIG. 5 or in strip shapes as illustrated in (c) of FIG. 5.

The light-emitting layer is formed, for example, by applying by ink-jet a colloidal solution formed by dispersing quantum dots in a solvent (dispersion medium). By applying a colloidal solution by ink-jet, an island shaped light-emitting layer (corresponding to a single subpixel) can be formed. In addition, in order to suppress the spread of the light-emitting layer during formation and to form the light-emitting layer only in a discretionary pixel, a bank-shaped protruding portion with liquid-repelling properties may be provided surrounding the periphery of the formed light-emitting layer.

The anodes (anode electrodes) 22 are formed by layering Indium Tin Oxide (ITO) and silver (Ag) or alloy containing Ag, for example, and have light reflectivity. The cathode (cathode electrode) 25 can be constituted by a light-transmissive conductive material such as a MgAg alloy (extremely thin film), ITO, and Indium Zinc Oxide (IZO).

In the display device 2, when a drive current flows between the anode 22 and the cathode 25 and holes and electrons recombine in the light-emitting layer, the resultant excitons emit light (fluorescence) when transitioning from the conduction band of the quantum dots to the valence band. Since the cathode 25 is transparent and the anode 22 has light reflectivity, the light emitted from the EL layer 24 travels upward (to the sealing layer 6 side) and becomes top-emitting.

The sealing layer 6 is transparent, and includes an inorganic sealing film 26 for covering the cathode 25, an organic buffer film 27 in an upper layer overlying the inorganic sealing film 26, and an inorganic sealing film 28 in an upper layer overlying the organic buffer film 27. The sealing layer 6 covering the light-emitting element layer 5 inhibits foreign matter, such as water and oxygen, from penetrating to the light-emitting element layer 5.

Each of the inorganic sealing film 26 and the inorganic sealing film 28 is an inorganic insulating film and can be formed of, for example, a silicon oxide film, a silicon nitride film, or a silicon oxynitride film, or a layered film of these, formed by CVD. The organic buffer film 27 is a transparent organic film having a flattening effect and can be formed of a coatable organic material such as acrylic resin. The organic buffer film 27 can be formed application by ink-jet, for example. The organic buffer film 27 may be provided, in the non-display region, with a bank for stopping droplets.

The tower face film 10 is a PET film, for example, bonded on the tower face of the resin layer 12 after the support substrate is peeled off, for achieving the display device 2 with excellent flexibility. The function film 39 has at least one of an optical compensation function, a touch sensor function, or a protection function, for example.

The above has described a case where the display device is manufactured as a flexible display. On the other hand, in a case in which a non-flexible display device is manufactured, generally, it is unnecessary to form the resin layer, replace the substrate, and the like. Thus, for example, the process of layering including steps S2 to S5 in FIG. 1 may be performed on a glass substrate, and then the process may proceed to step S9.

Note that described above is an example in which a top-emitting type (top emission) light-emitting element layer is formed on a TFT layer. However, the light-emitting element layer is not limited to being a top-emitting type, and may be a bottom-emitting (bottom emission) type, an inverted top-emitting (inverted top emission) type, or an inverted bottom-emitting (inverted bottom emission) type. In other words, the type of the light-emitting element layer is not particularly limited.

The configuration of the light-emitting element layer described above is not limited to:

(1) cathode/charge injection layer/charge transport layer/light-emitting layer/hole transport layer/hole injection layer/anode, and other configurations may be employed, such as:

(2) cathode/charge injection layer/charge transport layer/blocking layer/light-emitting layer/blocking layer/hole transport layer/hole injection layer/anode;

(3) cathode/charge injection layer/charge transport layer/light-emitting layer/blocking layer/hole transport layer/hole injection layer/anode;

(4) cathode/charge injection layer/charge transport layer/blocking layer/light-emitting layer/hole transport layer/hole injection layer/anode;

(5) cathode/charge injection layer/charge transport layer/light-emitting layer/hole transport layer/anode;

(6) cathode/charge transport layer/light-emitting layer/hole transport layer/hole injection layer/anode;

(7) cathode/charge transport layer/light-emitting layer/blocking layer/hole transport layer/hole injection layer/anode;

(8) cathode/charge transport layer/blocking layer/light-emitting layer/hole transport layer/hole injection layer/anode;

(9) cathode/charge transport layer/light-emitting layer/hole transport layer/anode;

(10) cathode/light-emitting layer/hole transport layer/anode;

(11) cathode/charge transport layer/light-emitting layer/anode; and

(12) cathode/light-emitting layer/anode.

First Embodiment

The light-emitting element layer (light-emitting element) 5 provided in the display device 2 according to the present embodiment includes the anode (anode electrode) 22, the cathode (cathode electrode) 25, and a light-emitting layer (quantum dot light-emitting layer) sandwiched between the anode and the cathode, the light-emitting layer including at least quantum dots and nanofibers. Furthermore, the method for manufacturing the display device according to the present embodiment is a method of forming a light-emitting layer by applying a colloidal solution including at least quantum dots and nanofibers by ink-jet.

The viscosity of the colloidal solution at room temperature (from 20 to 25° C.) is preferably from 5 mPa·s to 20 mPa·s, and more preferably from 5 mPa·s to 10 mPa·s. This allows the colloidal solution to be suitably applied (ejected) by ink-jet.

Examples of the solvent (dispersion medium) for forming the colloidal solution include methyl alcohol, ethyl alcohol, hexane, methyl ethyl ketone (MEK), ethyl acetate, chloroform, tetrahydrofuran (THF), benzene, chlorobenzene, 1,2-dichlorobenzene, toluene, and like organic solvents, or water. In the present embodiment, the viscosity of the colloidal solution can be adjusted via the nanofibers, so flexibility in the selection of the solvent (dispersion medium) can be increased, and generally speaking even a solvent with low viscosity that is unable to be applied by ink-jet can be used. Specifically, for example, the viscosity of ethyl alcohol at 20° C. is 1.200 mPa·s, the viscosity of methyl ethyl ketone at 20° C. is 0.40 mPa·s, the viscosity of chlorobenzene at 20° C. is 0.8 mPa·s, the viscosity of 1,2-dichlorobenzene at 25° C. is 1.324 mPa·s, the viscosity of toluene at 20° C. is 0.5866 mPa·s, the viscosity of water at 20° C. is 1.002 mPa·s, and none are suitable for application by ink-jet, However, even with these solvents, by adding nanofibers, the viscosity of the colloidal solution at room temperature (from 20 to 25° C.) can be adjusted (thickened) to from 5 mPa·s to 20 mPa·s.

The colloidal solution may or may not include a ligand. In a case in which the colloidal solution does not include a ligand, the solvent is not limited by the ligand. In addition, the colloidal solution preferably does not include a host material.

The quantum dots are particulate semiconductors having a diameter of from 2 to 10 nm (number of atoms for 100 to 10 thousand) constituted by group elements of group II-VI, III-V, or IV-VI. The quantum dots are used as a luminophore. The quantum dots may differ from each other in material, elemental concentration, and crystal structure in the center portion and the outer shell portion. Furthermore, the quantum dots may have different band gaps in the center portion and the outer shell portion, and the band gap may be larger in the outer shell than in the center portion. The quantum dots are dispersed in a solvent (dispersion medium) to form a colloidal solution. In addition, in order to suppress aggregation of the quantum dots in the colloidal solution and to increase the dispersibility and stability of the quantum dots, atoms and organic molecules may be attached to the surface of the quantum dots as ligands. Examples of organic molecules that are ligands include alkylthiol, alkylamine, carboxylic acid, oleic acid, organic silanes, and the like.

From the perspective of light emission characteristics, the amount of quantum dots in the colloidal solution is preferably about a few wt. %.

The nanofibers act as a viscosity adjusting agent (thickener) of the colloidal solution, and the colloidal solution is adjusted to a viscosity suitable for ink-jet. That is, the nanofibers have a high viscosity thickening characteristic and the viscosity (viscosity) and thixotropy of the solution (dispersion) can be controlled by adding nanofibers. Also, after drying the colloidal solution, uneven aggregation of the quantum dots can be suppressed.

Furthermore, by adding nanofibers to a colloidal solution including quantum dots and a solvent (dispersion medium), regardless of the viscosity of the solvent, it is possible to apply (eject) the colloidal solution by ink-jet, so that drying unevenness (so-called coffee ring) does not occur in the droplets after application. In addition, since the colloidal solution can be applied by ink-jet, an even light-emitting layer can be formed without unevenness in thickness and without cracking.

The diameter of the nanofibers included in the light-emitting layer is preferably less than the thickness of the light-emitting layer (typically from 5 to 30 nm). Thus, a diameter from 3 to 30 nm is preferable, a diameter less than the diameter of the quantum dots is more preferable, and a diameter as small as possible is even more preferable. When the diameter of the nanofibers exceeds 30 nm, unevenness readily occurs on the surface of the light-emitting layer, and the flatness of the interface decreases, so the light-emission characteristics may decrease. In addition, when the diameter of the nanofibers exceeds 30 nm, a region in which the quantum dots are not present in the film thickness direction of the light-emitting layer be formed.

Furthermore, the length of the nanofibers included in the light-emitting layer is preferably greater than the diameter of the quantum dots, a length ranging from not less than 2 times the thickness of the light-emitting layer to not greater than 1 μm is more preferable, and a length significantly greater than the thickness, such as from 60 nm to 1 μm, is even more preferable. In a case in which the length of the nanofibers is less than twice the thickness of the light-emitting layer, aligning parallel (horizontal) in the surface of the light-emitting layer is difficult and, therefore, unevenness in the surface of the light-emitting layer is likely to occur. In a case in which the length of the nanofibers is greater than 1 μm, the nozzle may be clogged when applying by ink-jet. Moreover, the pattern of the formed light-emitting layer may be poor.

By controlling the diameter and length of the nanofibers to be the diameter and length described above, the colloidal solution can be suitably applied (ejected) by ink-jet.

Note that in the present specification, the relationship between the quantum dots and the nanofibers is described using "diameter" as an indicator. Here, the term "diameter" refers to the diameter of a quantum dot, assumed to be a true sphere, and refers to the diameter of the cross-section of a nanofiber, assumed to be a perfect circle. However, in practice, there are no quantum dots that are true spheres and no nanofibers that are true circles in cross-section. However, even in a case in which the quantum dots have some distortions making them not a true sphere, the quantum dots can function in a substantially equivalent manner to quantum dots that are true spheres. Also, even when the cross-section of the nanofibers have a distortion, making them elliptical or strip-shaped, the nanofibers can function in a substantially equivalent manner to nanofibers with a perfect circle cross-section. Thus, the term "diameter" herein for quantum dots refers to a diameter converted from a perfect sphere quantum dot of the same volume and for nanofibers refers to the maximum width.

Furthermore, the number of quantum dots included in the light-emitting layer is preferably greater than the number of nanofibers. Specifically, the number ratio of nanofibers to quantum dots (nanofibers: quantum dots) is more preferably from 1:100 to 1:100,000,000, and more preferably from 1:10,000 to 1:10,000,000. By controlling the number ratio of quantum dots and nanofibers in this manner, a good light-emitting layer can be formed.

To keep the viscosity of the colloidal solution at room temperature (from 20° C. to 25° C.)) ranging from 5 mPa·s to 20 mPa·s, the amount of the nanofibers in the colloidal solution is preferably greater than 0 and not greater than 1 wt. %, and is preferably as low as possible while still affording a viscosity increasing effect. In a case in which the amount of the nanofibers exceeds 1 wt. %, the viscosity of the colloidal solution becomes too high, making the colloidal solution difficult to apply (eject) by ink-jet suitably. This can make it difficult to form a thin film. Furthermore, the amount of quantum dots included in the light-emitting layer decreases when the amount of nanofibers increases. Thus, light emission characteristics may decrease. Note that if the amount of the nanofibers is too small, the viscosity increasing effect cannot be obtained.

The nanofibers are not particularly limited as long as they are transparent and have insulating properties, but linear polysaccharide polymers (polysaccharides) are suitable. By modifying the polysaccharide polymer with a hydrophobic group, it can be readily and stably dispersed in an organic solvent. The nanofiber is more preferably a cellulose nanofiber in which glucose is a polysaccharide linked in a straight chain, a chitin nanofiber in which acetylglucosamine is a polysaccharide linked in a straight chain, or a lambda carrageenan used as a thickening agent for food products, even more preferably a cellulose nanofiber, and particularly preferably a TEMPO-oxidized cellulose nanofiber. A plurality of types of nanofibers may be used in combination as necessary. Note that the molecular structure of the terminal ends of the nanofibers differs depending on whether the nanofibers are dispersed in water or dispersed in an organic solvent.

The cellulose nanofiber can be readily and stably dispersed in water or an organic solvent, such as methyl alcohol, methyl ethyl ketone (MEK), ethyl acetate, toluene, and the like. The chitin nanofiber can be readily and stably dispersed in organic solvents, such as chloroform, tetrahydrofuran (THF), benzene, toluene, hexane, and the like.

The nanofibers may be further included in the charge transport layer and/or the hole transport layer as necessary. That is, the charge transport layer and/or the hole transport layer may be a layer containing nanofibers formed by applying a solution including at least nanofibers by ink-jet.

The TEMPO(2,2,6,6-tetramethylpiperidine-1-oxyradical) oxidized cellulose nanofiber is commercially available product, and, for example, has a diameter of 3 nm, is transparent, is without scattering, is highly insulating (>100 TΩ), and has a high dielectric constant (from 5 to 6 F/m).

Furthermore, even when the colloidal solution is applied by ink-jet, the nanofibers included in the colloidal solution after application, that is, the nanofibers included in the light-emitting layer, maintain a random state in the in-plane direction.

Figure 3:
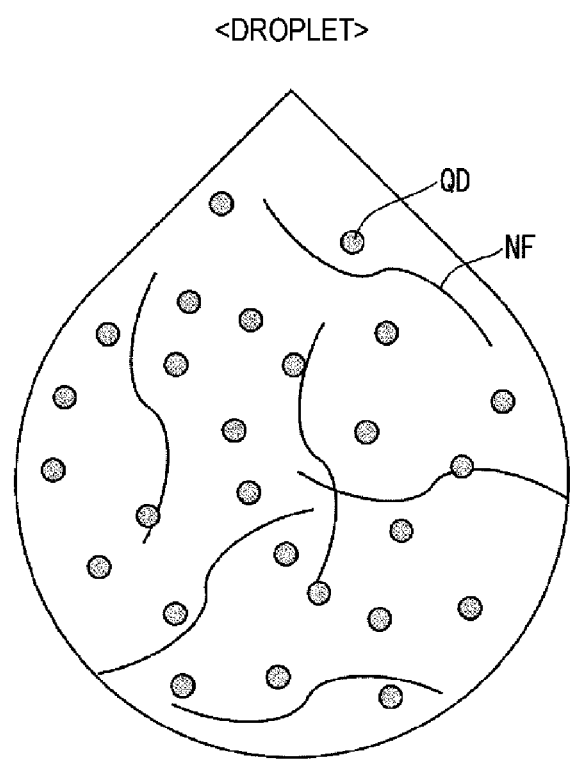
FIG. 3 is a diagram schematically illustrating a state of a colloidal solution (droplet) ejected by ink-jet.

FIG. 3 is a diagram schematically illustrating a state of a colloidal solution (droplet) ejected by ink-jet. As illustrated in FIG. 3, the quantum dots (QDs) and nanofibers (NF) in the droplets are in a random state.

Figure 4:
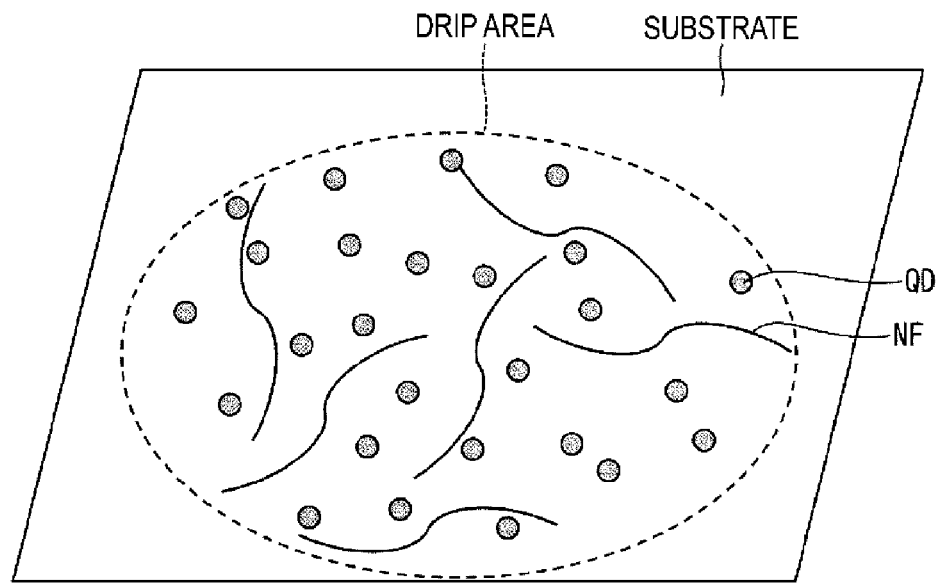
FIG. 4 is a plan view and a cross-sectional view schematically illustrating a state of a dried colloidal solution, that is a light-emitting layer, applied (dripped) onto a substrate.
Figure 4:
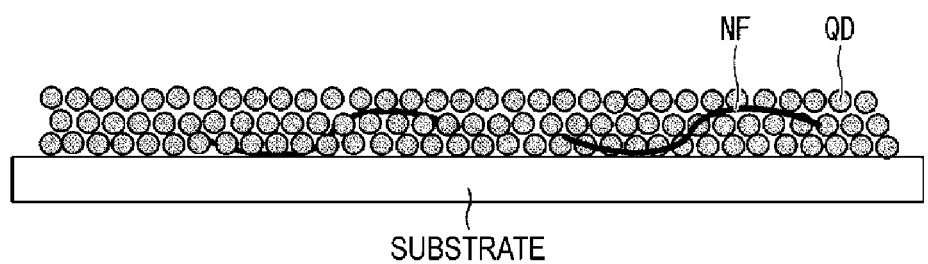

FIG. 4 is a plan view and a cross-sectional view schematically illustrating a state of a dried colloidal solution, that is a light-emitting layer, applied (dripped) onto a substrate. As illustrated in FIG. 4, the quantum dots (QD) are uniformly applied across the entire drip area and are arranged three-dimensionally, while the nanofibers (NF) are present, sewn between the quantum dots (QD), and are oriented with the length direction aligned with the substrate plane (surface) and remain random in the in-plane direction. The nanofibers are present in a random state in the in-plane direction with the nanofibers sewn between the quantum dots, thereby forming a uniform quantum dot light-emitting layer with no unevenness in thickness and no cracking. That is, because a uniform quantum dot light-emitting layer is formed, the quantum dot light emitting diodes (QLED) can emit light uniformly.

As described above, according to an aspect of the disclosure, a display device in which a uniform quantum dot light-emitting layer is formed without unevenness in thickness and no cracking can be provided. In addition, as described above, according to one aspect of the disclosure, a method for manufacturing a display device can be provided in which a colloidal solution can be applied (ejected) by ink-jet, regardless of the viscosity of the solvent, and drying unevenness (so-called coffee ring) does not occur in the droplets after application.

Supplement

An electro-optical element (an electro-optical element whose luminance and transmittance are controlled by an electric current) that is provided in a display device according to the present embodiment is not particularly limited thereto. Examples of the display device according to the present embodiment include an organic EL display provided with an OLED as the electro-optical element, an inorganic EL display provided with an inorganic light emitting diode as the electro-optical element, and a QLED display provided with a QLED as the electro-optical element.

Aspects

First Aspect
A display device includes:
a light-emitting element including
an anode electrode,
a cathode electrode, and
a quantum dot light-emitting layer sandwiched between the anode electrode and the cathode electrode,
wherein the quantum dot light-emitting layer includes at least quantum dots and nanofibers.
Second Aspect
In the display device according to the first aspect, a number of quantum dots included in the quantum dot light-emitting layer is greater than a number of nanofibers, for example.
Third Aspect
In the display device according to first aspect or the second aspect, a diameter of the nanofibers included in the quantum dot light-emitting layer is less than a diameter of the quantum dots; and a length of the nanofibers is greater than the diameter of the quantum dots, for example.

Fourth Aspect
In the display device according to any one of first to third aspects, a length of the nanofibers included in the quantum dot light-emitting layer ranges from not less than 2 times a thickness of the quantum dot light-emitting layer to not greater than 1 μm, for example.
Fifth Aspect
In the display device according to any one of first to fourth aspects, the light-emitting element further comprises a charge transport layer and a hole transport layer; and the charge transport layer and/or the hole transport layer include nanofibers, for example.
Sixth Aspect
In the display device according to any one of first to fifth aspects, the nanofibers are cellulose nanofibers, for example.
Seventh Aspect
In the display device according to any one of first to sixth aspects, the nanofibers are TEMPO-oxidized cellulose nanofibers, for example.
Eighth Aspect
A method for manufacturing a display device includes forming a quantum dot light-emitting layer by applying a colloidal solution including at least quantum dots and nanofibers by ink-jet.
Ninth Aspect
In the method for manufacturing a display device according to the eighth aspect, an amount of nanofibers in the colloidal solution is greater than 0 and less than or equal to 1 wt. %, for example.
Tenth Aspect
In the method for manufacturing a display device according to the eighth or ninth aspect, a viscosity of the colloidal solution at room temperature (from 20° C. to 25° C.) ranges from 5 mPa·s to 20 mPa·s.

The invention claimed is:
1. A display device, comprising:
a light-emitting element including
an anode electrode,
a cathode electrode, and
a quantum dot light-emitting layer sandwiched between the anode electrode and the cathode electrode,
wherein the quantum dot light-emitting layer includes at least quantum dots and nanofibers.
2. The display device according to claim 1,
wherein a number of the quantum dots included in the quantum dot light-emitting layer is greater than a number of the nanofibers.
3. The display device according to claim 1,
wherein a diameter of the nanofibers included in the quantum dot light-emitting layer is less than a diameter of the quantum dots, and
a length of the nanofibers is greater than the diameter of the quantum dots.
4. The display device according to claim 1,
wherein a length of the nanofibers included in the quantum dot light-emitting layer ranges from not less than 2 times a thickness of the quantum dot light-emitting layer to not greater than 1 μm.
5. The display device according to claim 1,
wherein the light-emitting element further comprises a charge transport layer and a hole transport layer, and
the charge transport layer and/or the hole transport layer include nanofibers.
6. The display device according to claim 1,
wherein the nanofibers are cellulose nanofibers.
7. The display device according to claim 1,
wherein the nanofibers are TEMPO-oxidized cellulose nanofibers.

8. A method for manufacturing a display device, comprising:
   forming a quantum dot light-emitting layer by applying a colloidal solution including at least quantum dots and nanofibers by ink-jet.

9. The method for manufacturing a display device according to claim 8,
   wherein an amount of nanofibers in the colloidal solution is greater than 0 and less than or equal to 1 wt. %.

10. The method for manufacturing a display device according to claim 8,
    wherein a viscosity of the colloidal solution at room temperature (from 20° C. to 25° C.) ranges from 5 mPa·s to 20 mPa·s.

* * * * *